United States Patent
Beck et al.

(10) Patent No.: US 11,898,237 B2
(45) Date of Patent: Feb. 13, 2024

(54) DEVICE AND METHOD FOR REMOVING COATING MATERIAL FROM OPENINGS IN A PART

(71) Applicant: Siemens Aktiengesellschaft, Munich (DE)

(72) Inventors: Thomas Beck, Panketal (DE); Jens Dietrich, Falkensee (DE); Oliver Katzurke, Berlin (DE); Sven Kreuziger, Aachen (DE); Marcel Krügerke, Wandlitz (DE); Andrea Massa, Berlin (DE); Richard Zimmermann, Berlin (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 215 days.

(21) Appl. No.: 17/251,782

(22) PCT Filed: Jul. 5, 2019

(86) PCT No.: PCT/EP2019/068128
§ 371 (c)(1),
(2) Date: Dec. 12, 2020

(87) PCT Pub. No.: WO2020/011674
PCT Pub. Date: Jan. 16, 2020

(65) Prior Publication Data
US 2021/0130946 A1    May 6, 2021

(30) Foreign Application Priority Data

Jul. 9, 2018   (DE) .................... 10 2018 211 284.3

(51) Int. Cl.
*C23C 14/54*   (2006.01)
*C23C 4/01*    (2016.01)
(Continued)

(52) U.S. Cl.
CPC .............. *C23C 14/54* (2013.01); *B23P 6/007* (2013.01); *C23C 4/01* (2016.01); *C23C 4/134* (2016.01);
(Continued)

(58) Field of Classification Search
CPC .......... C23C 4/18; C23C 14/54; C23C 14/04; C23C 14/30; C23C 14/5873; B23P 6/007; F01D 5/005; F01D 5/186; F01D 5/288
See application file for complete search history.

(56) References Cited

U.S. PATENT DOCUMENTS

| 5,154,885 A | 10/1992 | Czech |
| 5,993,980 A | 11/1999 | Schmitz |

(Continued)

FOREIGN PATENT DOCUMENTS

| CA | 2414019 A1 | 6/2003 |
| EP | 0486489 B1 | 11/1994 |

(Continued)

OTHER PUBLICATIONS

PCT International Search Report and Written Opinion of International Searching Authority dated Oct. 29, 2019 corresponding to PCT International Application No. PCT/EP2019/068128 filed May 7, 2019.

*Primary Examiner* — Michael P Wieczorek
(74) *Attorney, Agent, or Firm* — Wolter Van Dyke Davis, PLLC

(57) ABSTRACT

A method and device for coating a component wherein the cooling fluid ducts contained in the component have to be reopened following the coating step. The component has a first region and a second region, where the first region includes at least one cooling fluid opening having an adjoin- (Continued)

ing cooling fluid channel and where the first region is to be coated with a coating material which is not to be applied in the second region.

13 Claims, 1 Drawing Sheet

(51) Int. Cl.
    *C23C 4/134*     (2016.01)
    *B23P 6/00*     (2006.01)
    *C23C 4/18*     (2006.01)
    *C23C 14/04*     (2006.01)
    *C23C 14/30*     (2006.01)
    *C23C 14/58*     (2006.01)
    *F01D 5/00*     (2006.01)

(52) U.S. Cl.
    CPC ................ *C23C 4/18* (2013.01); *C23C 14/04* (2013.01); *C23C 14/30* (2013.01); *C23C 14/5873* (2013.01); *F01D 5/005* (2013.01)

(56) References Cited

U.S. PATENT DOCUMENTS

| | | | |
|---|---|---|---|
| 6,024,792 A | 2/2000 | Kurz | |
| 6,231,692 B1 | 5/2001 | Vogt | |
| 6,748,112 B1 | 6/2004 | Nguyen | |
| 7,725,210 B2 * | 5/2010 | Hoebel | B23K 26/389 |
| | | | 700/166 |
| 9,348,001 B2 * | 5/2016 | Reid | G01N 27/902 |
| 9,707,645 B2 | 7/2017 | Ozturk | |
| 2002/0157738 A1 | 10/2002 | Ralf | |
| 2003/0207151 A1 | 11/2003 | Stamm | |
| 2004/0011439 A1 | 1/2004 | Corrigan | |
| 2006/0113009 A1 | 6/2006 | Ralf | |
| 2006/0291716 A1 | 12/2006 | Vaidyanathan | |
| 2007/0241084 A1 | 10/2007 | Hoebel | |
| 2009/0248355 A1 * | 10/2009 | Kriegmair | B23K 26/389 |
| | | | 702/155 |
| 2013/0180108 A1 | 7/2013 | Arjakine | |
| 2016/0186626 A1 | 6/2016 | Bunker | |
| 2016/0348512 A1 | 12/2016 | Miranda | |
| 2017/0176291 A1 | 6/2017 | Bojappa | |

FOREIGN PATENT DOCUMENTS

| | | |
|---|---|---|
| EP | 0412397 B1 | 3/1998 |
| EP | 0892090 A1 | 1/1999 |
| EP | 0786017 B1 | 3/1999 |
| EP | 1306454 A1 | 5/2003 |
| EP | 1319729 A1 | 6/2003 |
| EP | 1204776 B1 | 6/2004 |
| EP | 1739409 A1 | 1/2007 |
| EP | 1844892 A1 | 10/2007 |
| EP | 2719494 A1 | 4/2014 |
| EP | 2845918 A1 | 3/2015 |
| EP | 2598835 B1 | 7/2015 |
| EP | 3040514 A1 | 7/2016 |
| EP | 3182059 A1 | 6/2017 |
| WO | 9967435 A1 | 12/1999 |
| WO | 0044949 A1 | 8/2000 |
| WO | 2011045343 A1 | 4/2011 |

* cited by examiner

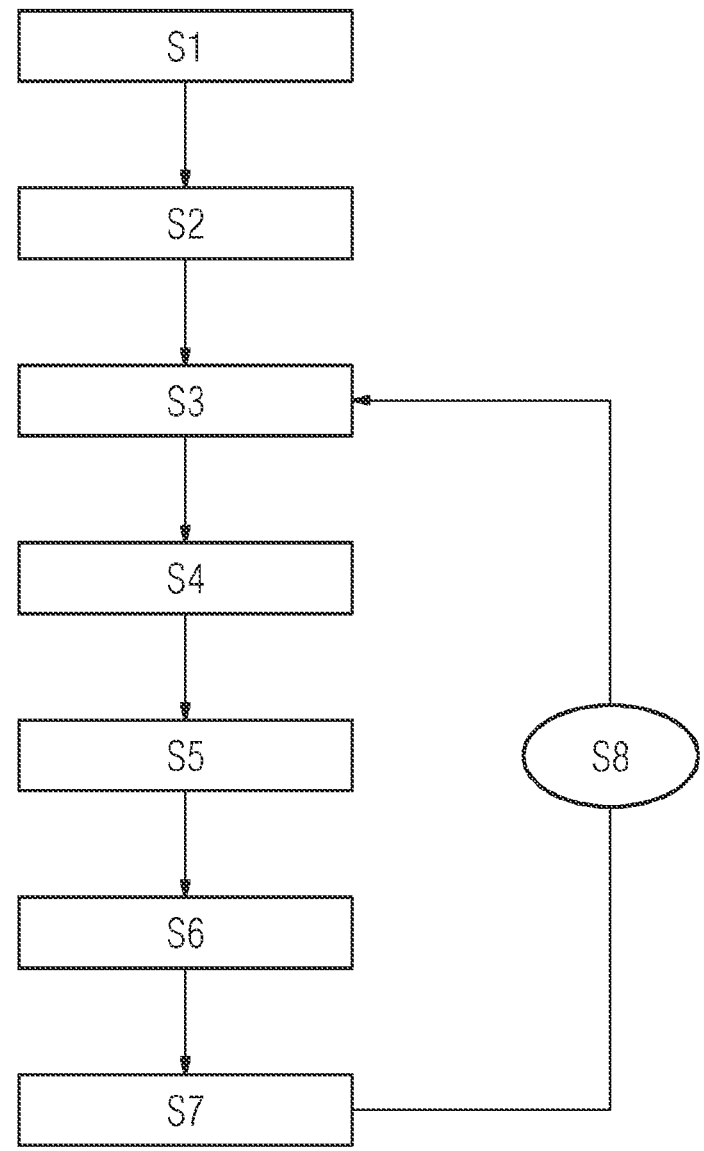

DEVICE AND METHOD FOR REMOVING COATING MATERIAL FROM OPENINGS IN A PART

CROSS REFERENCE TO RELATED APPLICATIONS

This application is the US National Stage of International Application No. PCT/EP2019/068128 filed 5 Jul. 2019, and claims the benefit thereof. The International Application claims the benefit of German Application No. DE 10 2018 211 284.3 filed 9 Jul. 2018. All of the applications are incorporated by reference herein in their entirety.

FIELD OF INVENTION

The present invention relates to a process for removing coating material from the cooling fluid openings of a component. The invention further relates to an apparatus which can be used in the process of the invention. The present invention further relates to the use of the process of the invention and the apparatus of the invention in the production or refurbishment of a component.

BACKGROUND OF INVENTION

Mechanically highly stressed components which are exposed to a hot and corrosive medium, for example turbine blades or other turbine components, are frequently made of superalloys having high hot strength and are additionally provided with expensive corrosion- and/or oxidation-inhibiting coatings and/or thermal barrier coatings. In addition, such components are typically equipped with internal cooling fluid channels by means of which cooling air can be conveyed through the component in order to quickly remove heat which has been taken up. When a cooling air film is additionally to be provided over the surface of the component so that the surface is not exposed directly to the hot and corrosive medium, the components have cooling air holes via which the cooling air is blown out from the interior of the component.

When a coating is applied to a component provided with cooling air openings, the cooling air holes are at least partially closed by the coating material. For this reason, they have to be opened again after conclusion of the coating process. This can occur by, for example, particular cooling air holes being selected as reference holes and then being closed by means of a masking material to which the coating material does not adhere readily before the coating process. After coating, the masking material in the reference holes is then either manually removed or burnt out in the event of a masking material which can be burnt out being employed. The position of the remaining holes is subsequently determined with the aid of the position of the reference holes. The further holes are subsequently opened again, for example by means of a laser program. However, a problem here is that even when the conception data for the component are available, deviations in respect of the position and orientation of the further channels can occur. This is attributable, for example, to different tolerances of various manufacturers. Furthermore, a change in the geometry of the component can occur during operation of the component. For this reason, the construction data cannot be entirely trusted in the refurbishment of previously used components.

However, existing processes and apparatuses suffer from the problem that even when the exact position of the cooling fluid openings in the coated region of the component has been laboriously determined, this information about the exact position cannot easily be used after coating. As a result of the coatings, appropriate markings on the surface and also the cooling fluid openings are covered, so that it has hitherto been necessary firstly to identify individual reference openings manually, so that these can, after manual opening of a cooling fluid opening, be used as reference for a system for automatic reopening of the cooling fluid openings. This is extremely laborious and time-consuming and not only incurs consequent costs but also causes a significant delay in the production or renovation of corresponding components.

There is therefore a need for a way of providing the exact position of the cooling fluid openings after such a coating step automatically without manual steps, so that such production processes or renovation processes can be carried out more quickly, more advantageously and with greater process reliability.

SUMMARY OF INVENTION

These objects are achieved by the process, the apparatus and the use as set forth in the independent claims. The dependent claims contain advantageous embodiments of the invention which provide further advantages which can also solve additional problems.

In one aspect, the invention provides a process for coating a component, where the component has a first region and a second region, where the first region comprises at least one cooling fluid opening having an adjoining cooling fluid channel and where the first region is to be coated with a coating material which is not to be applied in the second region, wherein the process comprises the following steps:

A) introduction of the component into a first apparatus suitable for detecting at least one reference point in the second region of the component and determining the position of at least one cooling fluid opening in the first region of the component, B) detection of the at least one reference point in the second region of the component and determination of the position of the at least one cooling fluid opening in the first region of the component by means of the first apparatus of step A), C) optionally removal of coating material which is present in the first region of the component, D) optionally repair of at least one occurrence of damage in the first region of the component, E) application of the coating material in the first region of the component, with the at least one cooling fluid opening being at least partly closed, F) detection of the at least one reference point in the uncoated second region of the component and removal of the coating material in the region of the at least one cooling fluid opening by means of a second apparatus, where the component is detachably connected, either indirectly or directly, to the second apparatus, where the second apparatus comprises at least one detection device, at least one holding device and at least one instrument for removing coating material in the region of the cooling fluid openings, where the holding device is suitable for providing direct or indirect, detachable fastening to the second region of the component, where the at least one detection device is suitable for detecting at least one reference point in the second region in order to determine the position of the at least one reference point and/or adapt the position of the component on the basis of the reference point, where the instrument for removing the coating material in the region of the cooling fluid openings is suitable for removing the coating material in a targeted manner from the cooling fluid openings on the basis of the position of the component determined by means of the detection device and/or the adapted position of the component in order to restore the functionality of the cooling fluid channels, where the first apparatus can also be an apparatus like the second apparatus or the first apparatus can be identical to the second apparatus.

It has surprisingly been found that highly accurate opening of the cooling fluid openings can be effected by means of the process of the invention without manual steps such as opening of reference openings being necessary. This not only simplifies and speeds up the process, but also allows, for example, data regarding the component to be obtained, so that these can later be utilized, for example, in process control for unambiguous identification and characterization of the component.

While the determination of the position of the at least one cooling fluid opening in the first region of the component is carried out by means of a measuring device, the detection of the at least one reference point in the second region of the component can be carried out in a different way. For example, a reference point can represent a characteristic structure on the component or the shape of the surface of the component, which are detected by means of a measuring device. However, the at least one reference point can, for example, also be detected mechanically. For example, this can be effected by contacting a specific position in the second region of the component. This is particularly advantageous since exact information in respect of the reference point, for example the position thereof in the internal coordinate system of the apparatus utilized for this purpose, can be obtained highly precisely and reliably by means of simple known methods. The reference point here can, for example, also be brought into contact by means of a constituent of the apparatus and thus be moved into a particular position.

In a further aspect, the invention provides an apparatus for opening cooling fluid openings of a coated component, where the component has a first region and a second region, where the first region comprises at least one cooling fluid opening having an adjoining cooling fluid channel and where the first region has been coated with a coating material which has not been applied in the second region, wherein the apparatus comprises at least one detection device, at least one holding device and at least one instrument for removing coating material in the region of the cooling fluid openings, where the holding device is suitable for providing either direct or indirect, detachable fastening to the second region of the component, where the at least one detection device is suitable for detecting at least one reference point in the second region in order to determine the position of the at least one reference point and/or adapt the position of the component on the basis of the reference point, where the instrument for removing the coating material in the region of the cooling fluid openings is suitable for removing the coating material in a targeted manner from the cooling fluid openings on the basis of the position of the component determined by means of the detection device and/or the adapted position of the component in order to restore the functionality of the cooling fluid channels.

In a further aspect, the invention provides for the use of the process of the invention and/or an apparatus of the invention in the production or refurbishment of a component of a turbo machine comprising a fluid stream, wherein the component comprises a first region and a second region, where the first region of the component is provided with a coating and is suitable for being exposed to the fluid stream of the turbo machine.

To give a more complete understanding of the present invention, reference is made to the comprehensive description below and the figures described in conjunction therewith. However, the figures are merely illustrative of the invention and represent only particularly advantageous embodiments and do not constitute a restriction of the invention.

BRIEF DESCRIPTION OF THE DRAWINGS

FIG. 1 shows a flow diagram of the process of the invention.

DETAILED DESCRIPTION OF INVENTION

In further embodiments, the first apparatus is an apparatus like the second apparatus or the first apparatus is identical to the second apparatus. Owing to the possibility of carrying out the process of the invention using a very simply constructed apparatus, the procurement price of the corresponding apparatus is very low. This allows an apparatus as is utilized in step F) also to be used economically feasibly for step B), even when constituents thereof are not necessary for step B). This offers advantages for the process since, for example, no adaptation to another reference system/coordinate system of another plant has to be carried out.

In addition, it has surprisingly been found that it is not necessary to additionally apply objects or markings to the component in order to obtain an appropriate reference point. Rather, an existing peculiarity and/or an existing feature of the component can be utilized for detection of the reference point by appropriate selection of the apparatus. This eliminates preparation steps and after-working steps, which surprisingly offsets the additional considerations and the additional outlay for providing a corresponding apparatus for measurement and processing. This has been found to be particularly advantageous for, for example, components such as turbine blades, e.g. rotor blades and guide vanes. In further embodiments, the component is advantageously suitable for its intended use without removal and/or modification of the reference point being necessary. In addition to or as an alternative, advantage is given, in further embodiments, to the reference point not being provided for the process of the invention. In particular, advantage is typically given to the reference point being an existing feature of the component.

Owing to the high accuracy of the determination of the position of the at least one cooling fluid opening in the first region of the component, it is possible to use this at least one cooling fluid opening as reference opening, so that it is not necessary to determine the position of all cooling fluid openings. This speeds up the measurement process significantly. In further embodiments, the at least one cooling fluid opening in the first region of the component serves as reference opening in step B), by means of which the position of at least one further cooling fluid opening in the first region of the component is derived.

As has been stated above, the mechanical detection of the reference point is surprisingly particularly advantageous. In particular, the reliability, speed and accuracy are particularly good here. In further embodiments, detection of the at least one reference point is therefore advantageously carried out by touching the reference point. For example, the mechanical detection can be carried out here using a 6 point nest in the second region of the component. In further embodiments, the at least one reference point comprises at least one 6-point nest.

Furthermore, it has been found that advantageous orientation of the component can be effected by means of detection of the at least one reference point. For example, the orientation of the component can be improved so that the instrument for removing the coating material in the region of the cooling fluid openings can be used with an improved angle with the assistance of the construction data. For example, an improved quality of the cooling fluid openings ultimately obtained and thus also the flows of the cooling fluid conveyed through the cooling fluid channel can be achieved in this way. In further embodiments, orientation of the component in the first apparatus and/or the second apparatus in step B) and/or F) is effected on the basis of the detection of the at least one reference point in the respective step. In particular, a corresponding orientation is advantageously effected in step F).

It has been found that the direct or indirect detachable fastening of the component in the first apparatus and/or second apparatus can be implemented in a variety of forms. Fastenings in which either a holding device which contacts the surface of the second region of the component is present directly in the apparatus or in the case of which fastening means to which a holding device which is to be fastened to the component can be fixed are provided in the interior of the apparatus have been found to be particularly advantageous. In further embodiments, the direct, detachable fastening of the component in the first apparatus and/or the second apparatus is achieved by means of a holding device which is a constituent of the first apparatus and/or the second apparatus and contacts the surface of the second region of the component, and/or the indirect, detachable fastening of the component is achieved by means of a holding device which is temporarily connected to the first apparatus and/or second apparatus and contacts the second region of the component. Advantage is typically given to the holding device used for the abovementioned indirect, detachable fastening being connected to the apparatus such as the first apparatus and/or second apparatus only for the time of the process of the invention. Here, for example, it is possible to use mobile holding devices which are connected to the component for the production process or refurbishment process and are moved with this component between various stations of the process. The use of a mobile holding device has typically been found to be particularly advantageous. Here, the component is fastened to the holding device which is in turn temporarily fixed, in particular, in the apparatus of the invention. At least a basic position and orientation of the component is typically maintained thereby even when the component is temporarily removed from the apparatus in between.

In addition, it has been observed that even damage at the cooling fluid openings or at the reference point can to a certain degree be corrected by means of fitting processes. In further embodiments, the data obtained in step B) are therefore advantageously corrected by means of fitting processes. In particular, corrections to the shape of the at least one reference point and the at least one cooling fluid opening are made here in order to correct, for example, a deviation from the ideal shape as a result of damage. This allows, for example, an exact determination of the intended position of the cooling fluid opening even in the case of damage to one side of the at least one cooling fluid opening.

Furthermore, it has typically been found to be advantageous to utilize data obtained in step B) in order to produce a data set concerning the relative position of the at least one cooling fluid opening relative to the at least one reference point. In particular, simple transfer of the data to another apparatus can be carried out thereby. For example, when the first apparatus and the second apparatus are not identical, especially when the first apparatus and the second apparatus do not have the same construction. In further embodiments, the relative position of the at least one cooling fluid opening in the first region of the component relative to the at least one reference point in the second region of the component is therefore advantageously determined from the data obtained in step B).

For example, the relative position of the at least one cooling fluid opening can be utilized to calculate, on the basis of the absolute position of the at least one reference point in step F), the absolute position of the at least one cooling fluid opening in this step, even when this opening is covered by the coating. In further embodiments, the process indicates a relative position of the at least one cooling fluid opening relative to the at least one reference point and an absolute position in the first apparatus in step B) and in the second apparatus in step F), and the absolute position of the at least one cooling fluid opening is therefore advantageously determined in step F) on the basis of the relative position of the at least one cooling fluid opening in step B) and detection of the at least one reference point in step F), and the removal of the coating material in step F) is carried out on the basis of the absolute position of the at least one cooling fluid opening.

To accelerate the process, it has also typically been found to be advantageous not to determine the positions of all cooling fluid openings by means of measurement methods but instead to calculate at least part of them. For this purpose, the position of further cooling fluid openings is determined, for example, with the aid of available construction data such as CAD data, with the cooling fluid opening whose position has actually been determined serving as reference point. The position of further cooling fluid openings has surprisingly been able to be determined sufficiently accurately in this way, with no excessive deviations from the actual position occurring for typical applications. This allows a significant speeding up of the process without the extremely high precision of the correct process being appreciably impaired. In further embodiments, the position of at least one further cooling fluid opening in the first region of the component is determined from the position of the at least one cooling fluid opening in the first region of the component obtained by means of the measuring device and the relative position of the at least one further cooling fluid opening on the basis of construction data, for example CAD data.

Particularly in the case of a relatively large number of such interpolated positions of the further cooling fluid opening, it has typically been found to be advantageous to integrate a control step into the process. In particular, one or more cooling fluid openings can be selected from among the interpolated cooling fluid openings either manually or automatically and the position thereof can likewise be determined in the measurement method in step B). In further embodiments, the position of at least one additional cooling fluid opening in the first region of the component is therefore advantageously measured in step B) in order to compare a position of a cooling fluid opening in the first region of the component which has been interpolated by means of the construction data with actual measured data, either manually or automatically, advantageously automatically. This allows, for example, potential errors in the construction data, which could have arisen, for example, as a result of excessively large manufacturing tolerances for the component, to be detected. The automatic checking of such positions makes it possible, for example, for the process to be modified in such a case so that the position of all of the cooling fluid openings is determined in step B). A successful reopening of the cooling fluid openings in the first region of the component can be carried out in step F) even without recourse to the construction data, which is not possible in this case.

It has also typically been found to be advantageous to allow regularities in the arrangement of the cooling fluid openings to go into the planning of the measurement method in step B). For example, in the case of cooling fluid openings arranged in rows, the speed of the process can be significantly increased by skillful selection of the interpolated and actually measured cooling fluid openings, but without the accuracy being appreciably impaired thereby. For example, it is typically advantageous when the rows comprise at least 5 cooling fluid openings and the position of at least one, advantageously two, of the cooling fluid openings in the respective row is determined. In further embodiments, the cooling fluid openings in the first region of the component are at least partly arranged in the form of rows comprising at least 5 cooling fluid openings and at least the position of the first, advantageously of the first and the last, cooling fluid opening of the rows is determined by means of the measuring device of the first apparatus in step B).

Furthermore, it has been observed that in the case of refurbishment, an improved quality in the determination of the position of the at least one cooling fluid opening is typically achieved when the coating to be removed in the first region of the component is removed before step B). In further embodiments, the removal of the coating in the first region of the component is therefore advantageously carried out before step B) in the case of refurbishment. The optional step C) is typically omitted here, as long as it is not found that further residues of coating are present and have to be removed.

In further embodiments, data obtained in step B) in respect of the position of the at least one cooling fluid opening are checked in respect of usability and the position of at least one further cooling fluid opening is determined if necessary. In particular, if the at least one cooling fluid opening is to serve as reference point to obtain, by means of interpolation, the exact position of the further cooling fluid opening on the basis of, for example, construction data, it has been found to be advantageous to check the measured data obtained for the at least one cooling fluid opening. If, for example, the exact position of the cooling fluid opening concerned is not able to be determined sufficiently accurately because of damage, it has been found to be advantageous for an alternative reference opening to be determined in this case.

In addition, it has typically been found to be advantageous for the first apparatus in step B) and the second apparatus in step F) to have the same coordinate system. This significantly assists transfer of the data obtained. In further embodiments, the first apparatus and the second apparatus advantageously have the identical coordinate system, and the first apparatus in step B) and the second apparatus in step F) are more advantageously apparatuses of the same construction type and are even more advantageously identical apparatuses. In particular, advantage is given to the fastening of the component at least in the apparatus in step F) being movable in such a way as to reverse changes in the position of the component between step B) and F) relative to the coordinate system of the apparatus.

It has typically also been found to be advantageous to store the data obtained by means of the first apparatus in step B). For example, storage can be effected on a transportable storage medium or in a storage unit integrated into a network. The transportable storage unit can subsequently be, for example for step F), connected to the second apparatus or the data obtained in step B) can be retrieved via a network connection from the storage unit integrated into the network. Even when the first apparatus is identical to the second apparatus, it has typically been found to be advantageous to store the data externally. For example, increased data security can be ensured thereby and even in the event of damage to the apparatus between step B) and F) the data can be utilized for a replacement apparatus.

The process of the invention has been found to be particularly advantageous for the production and refurbishment of components of a turbo machine. In particular, reopening of the closed cooling fluid openings can be carried out with the required high precision and nevertheless with great speed by this means. In further embodiments, the component is therefore advantageously a constituent of a turbo machine and the first region of the component is suitable for being exposed to the fluid stream of the turbo machine. The component can in principle be, in particular, any component of turbo machines which is provided with cooling fluid openings. Here, the cooling fluid openings typically serve as film cooling openings for cooling and protecting the corresponding component. In further embodiments, the component is therefore advantageously a blade or a heat shield. For example, it is a guide vane or rotor blade. Such guide vanes and rotor blades are employed, for example, in the turbine unit of steam turbines and gas turbines as examples of turbo machines or else in the compressor unit of turbo machines as examples of turbo machines. As particularly stressed components which regularly have to be subjected to maintenance comprising removal of an existing coating and application of a fresh coating, these components profit particularly therefrom. In further embodiments, the component is therefore advantageously selected from the group consisting of heat shields, guide vanes and rotor blades of a turbine and guide vanes and rotor blades of a compressor.

Such components are typically made at least partly of alloys which are resistant to high temperatures, for example iron-, nickel- or cobalt-based superalloys. Such superalloys are known, for example, from EP 1 204 776 B1, EP 1 306 454, EP 1 319 729 A1, WO 99/67435 or WO 00/44949. For example, nickel superalloys are frequently used since they are advantageous for many applications. Advantage is also given to the corresponding components being monocrystalline (SX structure).

The manufacture of such monocrystalline workpieces is carried out by, for example, directional solidification from the melt. These are casting processes in which the liquid metallic alloy solidifies to give a monocrystalline structure, i.e. a monocrystalline workpiece, or in a directional manner. Here, dendritic crystals are oriented along the heat flow and form either a rod-like crystalline grain structure (columnar, i.e. grains which extend over the entire length of the workpiece and are here, in accordance with general language usage, referred to as directionally solidified), or a monocrystalline structure, i.e. the entire workpiece consists of a single crystal. In these processes, the transition to globulitic (polycrystalline) solidification has to be avoided since undirected growth necessarily forms transverse and longitudinal grain boundaries which negate the good properties of the directionally solidified or monocrystalline component.

The expression directionally solidified microstructures thus generally refers to both single crystals which do not have any grain boundaries or at most small-angle grain boundaries and also columnar crystal structures which do have grain boundaries running in the longitudinal direction but no transverse grain boundaries. These second crystalline structures are also referred to as directionally solidified microstructures (directionally solidified structures).

Such processes are known from U.S. Pat. No. 6,024,792 and EP 0892090 A1.

The components can likewise have coatings to protect against corrosion or oxidation, e.g. (MCrAlX; M is at least one element from the group consisting of iron (Fe), cobalt (Co), nickel (Ni), X is an active element and represents yttrium (Y) and/or silicon and/or at least one element of the rare earths, or hafnium (Hf)). Such alloys are known from EP 0486489 B1, EP 0786017 B1, EP 0412397 B1 or EP 1306454 A1.

The density is advantageously 95% of the theoretical density.

A protective aluminum oxide layer (TGO=thermally grown oxide layer) is formed (as intermediate layer or as outermost layer) on top of the MCrAlX layer.

The layer composition is advantageously Co-30Ni-28Cr-8Al-0.6Y-0.7Si or Co-28Ni-24Cr-10Al-0.6Y. Apart from these cobalt-based protective coatings, it is also possible to use advantageously nickel-based protective layers such as Ni-10Cr-12Al-0.6Y-3Re or Ni-12Co-21Cr-11Al-0.4Y-2Re or Ni-25Co-17Cr-10Al-0.4Y-1.5Re.

Another thermal barrier coating, which is advantageously the outermost layer and consists, for example, of $ZrO_2$, $Y_2O_3$—$ZrO_2$, i.e. it is unstabilized, partially stabilized or fully stabilized by yttrium oxide and/or calcium oxide and/or magnesium oxide, can be present on top of the MCrAlX. The thermal barrier coating covers the entire MCrAlX layer.

Rod-shaped grains are produced in the thermal barrier coating by means of suitable coating methods such as electron beam vaporization (EB-PVD).

Other coating methods are conceivable, e.g. atmospheric plasma spraying (APS), LPPS, VPS or CVD. The thermal barrier coating can have porous grains having microcracks or macrocracks in order to give better thermal shock resistance. The thermal barrier coating is thus advantageously more porous than the MCrAlX layer.

Restoration (refurbishment) means that components may have to be freed of protective layers (e.g. by sand blasting) after they have been used. This is followed by removal of the corrosion and/or oxidation layers or products. If necessary, cracks or other damage in the component are also repaired. This is followed by recoating of the component in order to allow renewed use of the component.

The blade can be hollow or solid. If the blade is to be cooled, it is hollow and optionally also has film cooling holes.

In a further aspect, the present invention provides apparatuses which are particularly well suited for carrying out the process of the invention. Here, the term apparatus advantageously refers, unless indicated otherwise, to the second apparatus of the process. However, advantage is typically given to the apparatuses of the invention also being able to be used as first apparatus.

For example, it has typically been found to be advantageous to provide a particularly high mobility of the apparatus for removing the coating material. In further embodiments, advantage is therefore given to the instrument for removing the coating material to be fastened to a robotic arm.

It has also been found that particular instruments are advantageous for removing the coating material for typical applications. In further embodiments, the instrument for removing the coating material is therefore advantageously selected from the group consisting of laser drills and mechanical drills, more advantageously laser drills.

Furthermore, it is typically advantageous for the second apparatus used in step F) to have a measuring device which is suitable for determining at least the position of the cooling fluid openings, more advantageously for providing additional information in respect of the quality of the removal of the coating material. In further embodiments, advantage is therefore given to the apparatus advantageously comprising a measuring device which is suitable for determining the position of the at least one cooling fluid opening.

In addition, it is typically advantageous for the apparatus, advantageously the second apparatus used in step F), to offer a possibility of rotation. In further embodiments, the holding device is therefore advantageously movable and the movable holding device is suitable for providing a rotation of the component through at least 270°, advantageously through at least 360°, in the apparatus without the holding apparatus having to be detached. This has typically been found to be particularly advantageous in order to simplify the measurement operation in step B) and/or the processing step in step F). These apparatuses are typically advantageous since, for example, particularly high speeds of the process can be achieved for typical applications.

The invention will be described in detail below with reference to the single FIGURE. Here, it should be pointed out that the FIGURE is merely schematic and no lack of performability of the invention can be derived therefrom. In particular, the drawing is not to be construed as restricting the invention, whose scope is specified only by the claims.

Furthermore, it should be pointed out that the technical features presented below are intended to be claimed in any combination with one another as long as this combination can achieve the object of the invention.

FIG. 1 shows a flow diagram of the process of the invention. Here, a component which comprises a first region and a second region is processed. The first region of the component has at least one cooling fluid opening having a cooling fluid channel adjoined thereto, and this region is to be coated with a coating material. In the second region of the component, the application of such a coating is not necessary since this region is, for example, not to be exposed to the fluid stream of a turbo machine. Examples of such a component are heat shields, guide vanes and rotor blades of a turbine and guide vanes and rotor blades of a compressor as are to be found in turbo machines.

Before the component to be processed is introduced into step A), prior steps such as removal of an existing coating and/or repair of damage on the component can be carried out, for example, especially in the case of refurbishment of a component. This has, for example, the advantage that the subsequent determination of the position of the at least one cooling fluid opening in the first region of the component can typically be carried out with greater accuracy.

After such basic steps which are typically carried out beforehand, the component to be processed is introduced, in S1, into a first apparatus as described under A). The apparatus here is suitable for measuring at least one reference point in the second region of the component and determining the position of at least one cooling fluid opening in the first region of the component.

Step B) of the process of the invention is subsequently carried out in S2. Here, the at least one reference point in the second region of the component is detected. Furthermore, the position of the at least one cooling fluid opening in the first region of the component is determined. For example, a characteristic place or the shape of a characteristic region can serve as reference point and this can be detected by means of a measuring device which is also used for determining the position of the at least one cooling fluid opening in the first region. However, different measuring devices or other means for detecting the at least one reference point can also be used. For example, the reference point can be mechanically contacted, for example, in order to obtain the required data for the reference point. An example of such a reference point is a 6-point nest which is advantageously mechanically contacted. From the data obtained in S2, it is possible to derive, for example, the relative position of the at least one reference point in the second region of the component and of the at least one cooling fluid opening in the first region of the component.

After this, the removal of coating material, as is described in step C), can optionally be carried out in S3. For example, this can be necessary when only part of the coating in the first region of the component has previously been removed.

If the component is also damaged, this damage can be repaired as described in step D) in S4.

In S5, the application as described in step E) of the coating material in the first region of the component is carried out. This results in at least partial, typically complete, closure of the cooling fluid opening in the first region of the component.

The at least one reference point in the second region of the component is subsequently detected in S6. Although the process of the invention can be carried out entirely in a single apparatus, it is typically advantageous, in order to optimize the process, to carry out at least some of the steps, for example repair steps or the application of the coating in the first region of the component, outside the first apparatus utilized in step B) and/or the second apparatus utilized in step F).

The second apparatus utilized in step F) is suitable for fixing the component either directly or indirectly by means of a detachable fastening, for detecting the at least one reference point in the second region of the component and for removing the coating material in the region of the at least one cooling fluid opening by means of an instrument integrated into the apparatus. An apparatus as has also been used in step B) can optionally be used in step F). In particular, the identical apparatus can also be used.

As direct, detachable fastening of the component, it is possible to use, for example, a holding device present in the apparatus. This can contact and thereby mechanically fix the component in the second region. For this purpose, the holding device can, for example, grasp the component from opposite sides by means of suitably shaped counterpieces of the corresponding part of the second region of the component. For example, in the case of a "Christmas tree" arrangement customary for turbine blades, the corresponding constituent of the holding device can be configured as corresponding negative. The use of such a specific holding device has, for example, the advantage that a particular orientation of the component is prescribed.

As indirect detachable fastening of the component, it is possible to use, for example, a mobile holding device for the component. Here, the holding device is typically fastened to the component for the entire process of the invention. This is, for example, effected by means of a clamping process as described above for the direct detachable connection. This fastening again offers the possibility of being detachably fastened within the apparatus. Very precise orientation of the component within the apparatus can be achieved here by the setting-down of appropriate fastening points within the apparatus, so that apart from the determination of the reference point, only minor corrections are, for example, necessary for determining the exact position of the cooling fluid opening. Since the fastening can also be configured so that an otherwise labile component, for example a turbine blade, can be fixed in position in a stable manner, this has further process engineering advantages. For example, such a mobile holding device can offer simplified gripping and simplified transport between individual stations of the process.

The positions of further cooling fluid openings in the first region of the component can optionally be determined here. A random selection of such cooling fluid openings to be determined can, for example, be carried out automatically in order to provide a control opportunity for deviation from the construction data. This is of particular importance when the position of further cooling fluid openings in the first region of the component is interpolated for removal of the coating material there. Such interpolation of the further cooling fluid openings in the first region of the component is, for example, particularly advantageous in the case of cooling fluid openings arranged in rows. Determination of the position of, for example, at least one cooling fluid opening at the beginning of the row or, for example, at least the cooling fluid openings at the beginning and the end of the row enables the cooling fluid openings located in between to be interpolated with high accuracy.

In S7, orientation of the component within the apparatus can be carried out. Such orientation is based on the position of the reference point detected and can, for example, improve the position and orientation of the component. Such an improvement can, for example, simplify the removal of the coating material in step F) or increase the accuracy.

The removal of the coating material in step F) is necessary in order to restore the functionality of the cooling fluid openings and the adjoining cooling fluid channels. For example, the instrument can comprise a laser drill or a mechanical drill. The instrument for removing the coating material can be fastened to a robotic arm in order to provide very great mobility.

After removal of the coating material in the region of the at least one cooling fluid opening in S7, a control step can optionally be carried out. For this purpose, it is possible to utilize, in particular, an apparatus of the invention which also comprises a measuring device which can determine at least the position of the cooling fluid openings. The measuring device can advantageously provide further information which allows, for example, conclusions to be drawn in respect of the quality of the removal of the coating material in the region of the respective cooling fluid opening. For example, a measuring device based on interferometry can be utilized for this purpose. If deficiencies are found, the component can, for example, be returned to an earlier step of the process of the invention as depicted by means of S8. For example, the component can be freed of the coating in S3 before once again going through the following steps.

The invention claimed is:

1. A process for coating a component, wherein the component comprises a first region and a second region, wherein the first region comprises at least one cooling fluid opening comprising an adjoining cooling fluid channel, and wherein the first region is to be coated with a coating material which is not to be applied in the second region, the process comprising the following steps:

A) introducing the component into a first apparatus suitable for: detecting at least one reference point in the second region of the component; and determining a position of at least one cooling fluid opening in the first region of the component, B) detecting the at least one reference point in the second region of the component and determining the position of the at least one cooling fluid opening in the first region of the component by means of the first apparatus, C) optionally removing coating material which is present in the first region of the component, D) optionally repairing at least one occurrence of damage in the first region of the component, E) applying the coating material in the first region of the component, wherein the at least one cooling fluid opening is at least partly closed by the coating material, F) detecting the at least one reference point in the uncoated second region of the component and removing the coating material in the first region of the at least one cooling fluid opening by means of a second apparatus, wherein the second apparatus comprises at least one detection device, at least one holding device, and at least one instrument for removing coating material in the first region of cooling fluid openings, wherein the at least one holding device is suitable for providing direct or indirect, detachable fastening of the second region of the component to the second apparatus, wherein the at least one detection device is suitable for detecting the at least one reference point in the second region in order to determine the position of the at least one reference point and/or to adapt a position of the component on the basis of the at least one reference point, wherein the at least one instrument for removing the coating material in the first region of the cooling fluid openings is suitable for removing the coating material in a targeted manner from the cooling fluid openings on the basis of the position of the component determined by means of the at least one detection device and/or an adapted position of the component in order to restore functionality of the cooling fluid channels, and wherein the detecting of the at least one reference point is carried out by touching the at least one reference point.

2. The process as claimed in claim 1,
wherein the first apparatus and the second apparatus are the same apparatus.

3. The process as claimed in claim 1,
wherein the at least one cooling fluid opening in the first region of the component in step B) serves as reference opening with the aid of which a position of at least one further cooling fluid opening in the first region of the component is derived.

4. The process as claimed in claim 1,
wherein the at least one reference point comprises at least one 6 point nest.

5. The process as claimed in claim 1,
wherein the at least one cooling fluid opening comprises a relative position relative to the at least one reference point and an absolute position in the first apparatus in step B) and the second apparatus in step F),
where the absolute position of the at least one cooling fluid opening is determined in step F) on the basis of the relative position of the at least one cooling fluid opening in step B) and detection of the at least one reference point in step F), and
where removal of the coating material as in step F) is carried out on the basis of the absolute position of the at least one cooling fluid opening.

6. The process as claimed in claim 1,
wherein reorientation of the component in the first apparatus and/or the second apparatus is carried out in step B) and/or F) on the basis of the detecting of the at least one reference point in the respective step.

7. The process as claimed in claim 1,
wherein the at least one holding device is a constituent of the first apparatus and/or the second apparatus and contacts a surface of the second region of the component, or
wherein the at least one holding device is temporarily connected to the first apparatus and/or the second apparatus and contacts the second region of the component.

8. The process as claimed in claim 1,
wherein a position of at least one further cooling fluid opening in the first region of the component is determined from:
the position of the at least one cooling fluid opening in the first region of the component obtained by means of the at least one detection device; and
a relative position of the at least one further cooling fluid opening relative to the at least one cooling fluid opening on the basis of construction data and/or CAD data.

9. The process as claimed in claim 1,
wherein data obtained in step B) in respect of the position of the at least one cooling fluid opening are checked for accuracy, and
wherein a position of at least one further cooling fluid opening is determined.

10. The process as claimed in claim 1,
wherein the first apparatus and the second apparatus comprise an identical coordinate system, and wherein the first apparatus and the second apparatus are the same apparatus.

11. A method for producing or refurbishing a component of a turbo machine comprising a fluid stream, wherein the component comprises a first region and a second region, wherein the first region of the component is provided with a coating and is suitable for being exposed to the fluid stream of the turbo machine, the method comprising:
coating the component according to the process of claim 1.

12. The method as claimed in claim 11,
wherein the component is selected from a group consisting of heat shields, guide vanes and rotor blades of a turbine and guide vanes and rotor blades of a compressor.

13. The process as claimed in claim 1,
wherein the at least one instrument for removing coating material in the first region of the cooling fluid openings comprises a laser drill or a mechanical drill.

* * * * *